(12) United States Patent
Huang

(10) Patent No.: US 7,427,855 B2
(45) Date of Patent: Sep. 23, 2008

(54) CIRCUIT FOR MEASURING INRUSH CURRENT

(75) Inventor: Jian-Xiong Huang, Shenzhen (CN)

(73) Assignees: Hong Fu Jin Precision Industry (Shenzhen) Co., Ltd., Bao-an District, Shenzhen, Guangdong Province (CN); Hon Hai Precision Industry co., Ltd., Tu-Cheng, Taipei Hsien (TW)

( * ) Notice: Subject to any disclaimer, the term of this patent is extended or adjusted under 35 U.S.C. 154(b) by 328 days.

(21) Appl. No.: 11/321,312

(22) Filed: Dec. 29, 2005

(65) Prior Publication Data

US 2007/0030710 A1    Feb. 8, 2007

(30) Foreign Application Priority Data

Aug. 5, 2005    (CN) .......................... 2005 1 0036432

(51) Int. Cl.
G01R 31/36    (2006.01)
(52) U.S. Cl. .................. 324/117 R; 324/771
(58) Field of Classification Search .................. 324/772
See application file for complete search history.

(56) References Cited

U.S. PATENT DOCUMENTS

| 3,710,157 | A | * | 1/1973 | Wright | ........................ 307/131 |
| 4,333,049 | A | | 6/1982 | Yui et al. | |
| 5,420,780 | A | * | 5/1995 | Bernstein et al. | ............... 363/69 |
| 5,715,154 | A | * | 2/1998 | Rault | ........................ 363/89 |
| 6,353,545 | B1 | * | 3/2002 | Ueda | ........................ 363/40 |
| 6,735,064 | B2 | * | 5/2004 | Miyazaki | ..................... 361/58 |

* cited by examiner

Primary Examiner—Vinh P Nguyen
(74) Attorney, Agent, or Firm—Morris Manning Martin LLP; Tim Tingkang Xia, Esq.

(57) ABSTRACT

A circuit for testing an inrush current of a power supply includes a rectifier (10), a capacitor (30), and an ammeter (90). The rectifier includes input terminals (1) adapted to connect with an AC supply (Vin), and output terminals (3) adapted to supply a direct voltage. The capacitor is connected in parallel to the output terminals of the rectifier. The ammeter is connected between the capacitor and the power supply. The capacitor is charged by the AC supply via the rectifier. When the voltage of the capacitor reaches a pre-determined value, the capacitor supplies energy to the power supply, and the ammeter measures the magnitude of the inrush current.

17 Claims, 1 Drawing Sheet

CIRCUIT FOR MEASURING INRUSH CURRENT

BACKGROUND OF THE INVENTION

1. Field of the Invention

The present invention relates to a circuit, and more particularly to a circuit for measuring inrush current.

2. General Background

At the moment a computer is powered on, there is an inrush current in the power supply of the computer. If the inrush current is too great, the power supply is easily damaged, so the power supply needs to be measured before being used with the computer.

The tester often uses a public alternating current source as the test electrical source. But the public alternating current is unstable and variable, so the measurement of the magnitude of the tested inrush current is not reliable. In this situation, the tester may not be sure the power supply meets performance standards. The tester must repeatedly measure the power supply to be sure it can withstand the inrush current without damage. This is a time-consuming and imprecise procedure.

What is needed, therefore, is a circuit for measuring the inrush current more precisely and without costly repetition.

SUMMARY

A circuit for measuring an inrush current of a power supply includes a rectifier, a capacitor, and an ammeter. The rectifier includes input terminals adapted to connect with an AC supply, and output terminals supplying a direct voltage. The capacitor is connected in parallel to the output terminals of the rectifier. The ammeter is connected between the capacitor and the power supply. The capacitor is charged by the AC supply via the rectifier, then the capacitor supplies energy to the power supply, and the ammeter measures the magnitude of the inrush current.

Other advantages and novel features will be drawn from the following detailed description of a preferred embodiment with attached drawings, in which:

DETAILED DESCRIPTION OF THE EMBODIMENTS

Figure 1:
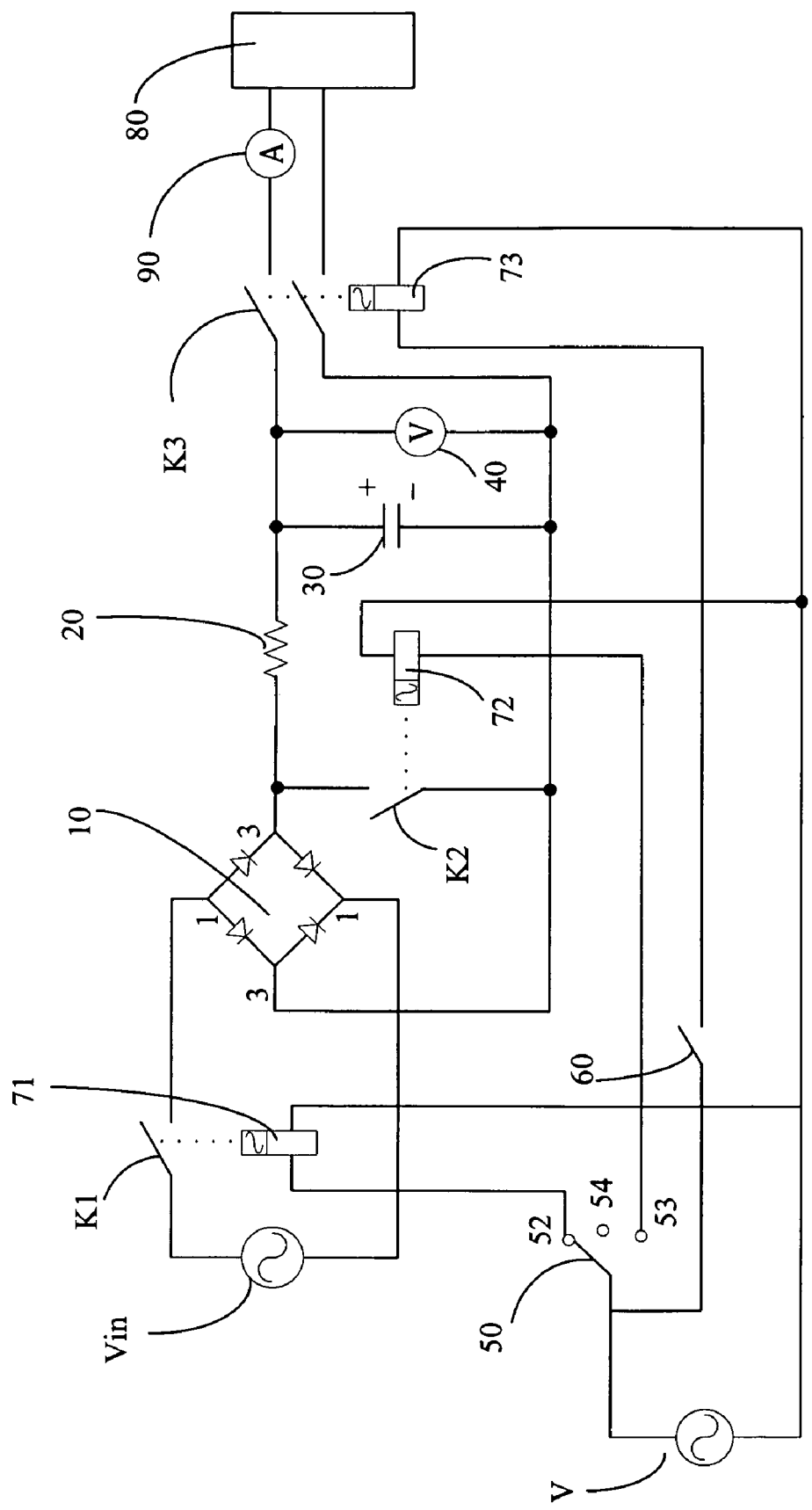
FIG. 1 is a circuit diagram of a preferred embodiment of a circuit for measuring inrush current. The drawing is the only drawing of this application.

Referring to the drawing, a circuit for measuring inrush current of a power supply 80 in accordance with a preferred embodiment of the present invention includes an AC (alternating current) supply Vin, a rectifier 10, a resistor 20, a capacitor 30 for providing an electrical source for the measuring, and an ammeter 90.

The rectifier 10 is a known rectifier bridge, with two input terminals 1 and two output terminals 3. The AC supply Vin is coupled to the input terminals 1 via a switch K1. The capacitor 30 is connected parallel to the output terminals 3 of the rectifier 10. A voltmeter 40 is connected parallel to the capacitor 30 for measuring the magnitude of the voltage of the capacitor 30. The resistor 20 is coupled between one of the output terminals 3 of the rectifier 10 and the positive electrode of the capacitor 30. A switch K2 is coupled between one of the electrodes of the resistor 20 and the negative electrode of the capacitor 30.

A power supply 80 is connected parallel to the capacitor 30, and a switch K3 is set between the power supply 80 and the capacitor 30 to open and close the circuit. An ammeter 90 is coupled between the positive electrode of the capacitor 30 and one of the electrodes of the power supply 80 for measuring inrush current of the power supply 80.

The switches K1, K2, and K3 are controlled by relays 71, 72, and 73 respectively.

The relays 71, 72, and 73 are controlled by a controlling supply V and switches 50, 60. The switch 50 is a multi-way switch with 3 conducting positions identified as a first position 52, a second position 53, and a third position 54. When the switch 50 is switched to the first position 52, the relay 71 is activated thereby connecting the switch K1. When the switch 50 is switched to the second position 53, the relay 72 is activated thereby connecting the switch K2 and the switch K1 is disconnected. When the switch 50 is switched to the third position 54, the switches K1 and K2 are both disconnected. The switch K1 and the switch K2 cannot be connected at the same time in order to protect the rectifier 10.

Initially, in use the switch 60 is disconnected, and the switch 50 is in the third position 54. Then, the switch 50 is switched to the first position 52 thereby connecting the switch K1. The AC supply Vin charges the capacitor 30 via the rectifier 10. The voltmeter 40 measures the magnitude of the voltage of the capacitor 30. When the magnitude of the voltage of the capacitor 30 reaches a pre-determined value, the switch 50 is then switched to the third position 54. The switch 60 is connected which in turn connects the switch K3, so the capacitor 30 then supplies energy to the power supply 80. The magnitude of the inrush current is then measured by the ammeter 90.

The remaining electrical energy of the capacitor 30 can be discharged by connecting the switch K2 after the magnitude of the inrush current is measured.

It is to be understood that although numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A circuit for measuring an inrush current of a power supply, the circuit comprising:
   a rectifier which includes input terminals adapted to connect with an AC supply, and output terminals which supply a direct voltage;
   a capacitor connected in parallel to the output terminals of the rectifier; and
   an ammeter connected between the capacitor and the power supply;
   wherein the capacitor is charged by the AC supply via the rectifier, the capacitor supplies energy to the power supply, and the ammeter measures the magnitude of the inrush current.

2. The circuit as described in claim 1, wherein the rectifier is a rectifier bridge.

3. The circuit as described in claim 1, wherein a resistor is coupled between one of the output terminals of the rectifier and one of the electrodes of the capacitor.

4. The circuit as described in claim 3, wherein a switch is coupled between the resistor and the capacitor to form a discharging circuit.

5. The circuit as described in claim 4, further comprising a multi-way switch to control the charging or discharging of the capacitor.

6. The circuit as described in claim 1, further comprising a switch to control the capacitor supplying energy to the power supply.

7. The circuit as described in claim 1, wherein a voltmeter is connected parallel to the capacitor for measuring the magnitude of the voltage of the capacitor.

8. A circuit for measuring an inrush current of a power supply, the circuit comprising:
   an apparatus for storing electrical energy, the apparatus connected to the power supply;
   a charging circuit for charging the apparatus;
   an ammeter connected between the apparatus and the power supply for measuring the magnitude of the inrush current when the apparatus supplies said electrical energy to the power supply; and
   a discharging circuit for discharging the remaining electrical energy of the apparatus.

9. The circuit as described in claim 8, wherein the apparatus is a capacitor.

10. The circuit as described in claim 9, wherein the charging circuit comprises a rectifier for transforming alternating current into direct current to charge the capacitor.

11. The circuit as described in claim 9, wherein a voltmeter is connected parallel to the capacitor for measuring the magnitude of voltage of the capacitor.

12. The circuit as described in claim 8, wherein the discharging circuit comprises a resistor and a switch.

13. The circuit as described in claim 8, further comprising a multi-way switch to control the charging or discharging of the apparatus.

14. The circuit as described in claim 8, further comprising a switch to control the apparatus supplying energy to the power supply.

15. A circuit assembly for measuring inrush current of a power supply, comprising:
   a power supply to be measured;
   a power source to provide available power to said power supply;
   an intermediate apparatus electrically connectable between said power supply and said power source, and capable of reserving electrical energy from said power source when electrical connection thereof with said power source is established and releasing said electrical energy to said power supply when another electrical connection thereof with said power supply is established;
   a switch means capable of selectively and exclusively establishing one of said electrical connection between said apparatus and said power source, and said another electrical connection between said apparatus and said power supply; and
   measure means electrically connectable between said intermediate apparatus and said power supply for measuring inrush current input into said power supply.

16. The circuit assembly as described in claim 15, wherein said intermediate apparatus is a capacitor.

17. The circuit assembly as described in claim 15, wherein said measure means is an ammeter capable to measure said inrush current of said power supply when said apparatus is releasing said electrical energy to said power supply.

* * * * *